(12) United States Patent
Bolzmann et al.

(10) Patent No.: US 7,907,401 B2
(45) Date of Patent: Mar. 15, 2011

(54) HOUSING FOR AN ELECTRONIC UNIT

(75) Inventors: Oliver Bolzmann, Hannover (DE);
Matthias Grimm, Hannover (DE);
Oliver Gründker, Wedemark (DE);
Joachim Lehrmann, Lehrte (DE);
Frauke Rathjen, Hannover (DE)

(73) Assignee: WABCO GmbH, Hannover (DE)

( * ) Notice: Subject to any disclaimer, the term of this patent is extended or adjusted under 35 U.S.C. 154(b) by 3 days.

(21) Appl. No.: 12/383,585

(22) Filed: Mar. 24, 2009

(65) Prior Publication Data
US 2009/0244838 A1 Oct. 1, 2009

(30) Foreign Application Priority Data

Mar. 29, 2008 (DE) .......................... 10 2008 016 347

(51) Int. Cl.
*H05K 7/20* (2006.01)
*H05K 5/02* (2006.01)
(52) U.S. Cl. ....... 361/690; 361/720; 174/547; 439/76.2; 454/184
(58) Field of Classification Search .................. 361/690, 361/719–720; 174/522, 526, 547; 439/76.1–76.2; 454/184
See application file for complete search history.

(56) References Cited

U.S. PATENT DOCUMENTS

| 4,618,071 | A | * | 10/1986 | Vincent | 220/371 |
| 6,827,232 | B1 | * | 12/2004 | Hara et al. | 220/371 |
| 7,083,660 | B2 | * | 8/2006 | Hara et al. | 55/385.4 |
| 7,189,918 | B2 | * | 3/2007 | Sakata | 174/17 VA |
| 7,253,356 | B2 | * | 8/2007 | Kiyota et al. | 174/17 VA |
| 7,344,578 | B2 | * | 3/2008 | Origlia | 55/385.4 |
| 7,396,391 | B2 | * | 7/2008 | Waida | 96/4 |
| 7,442,334 | B2 | * | 10/2008 | Hara et al. | 264/257 |
| 7,561,430 | B2 | * | 7/2009 | Tiedemann et al. | 361/719 |
| 7,570,492 | B2 | * | 8/2009 | Gall et al. | 361/760 |
| 7,667,973 | B2 | * | 2/2010 | Shinoda et al. | 361/752 |
| 2005/0207114 | A1 | * | 9/2005 | Gall et al. | 361/690 |
| 2008/0266810 | A1 | * | 10/2008 | Tiedemann et al. | 361/719 |

* cited by examiner

*Primary Examiner* — Robert J Hoffberg
(74) *Attorney, Agent, or Firm* — Kramer Levin Naftalis & Frankel LLP

(57) ABSTRACT

An electronic unit housing includes (i) a receiving space for receiving a printed circuit board, (ii) at least one foot, which is designed to fasten the electronic unit housing onto a base, and is disposed to the side of the receiving space relative to a projection of the receiving space onto the base, and (iii) a venting device, which opens on the underside of the electronic unit housing facing the base.

8 Claims, 4 Drawing Sheets

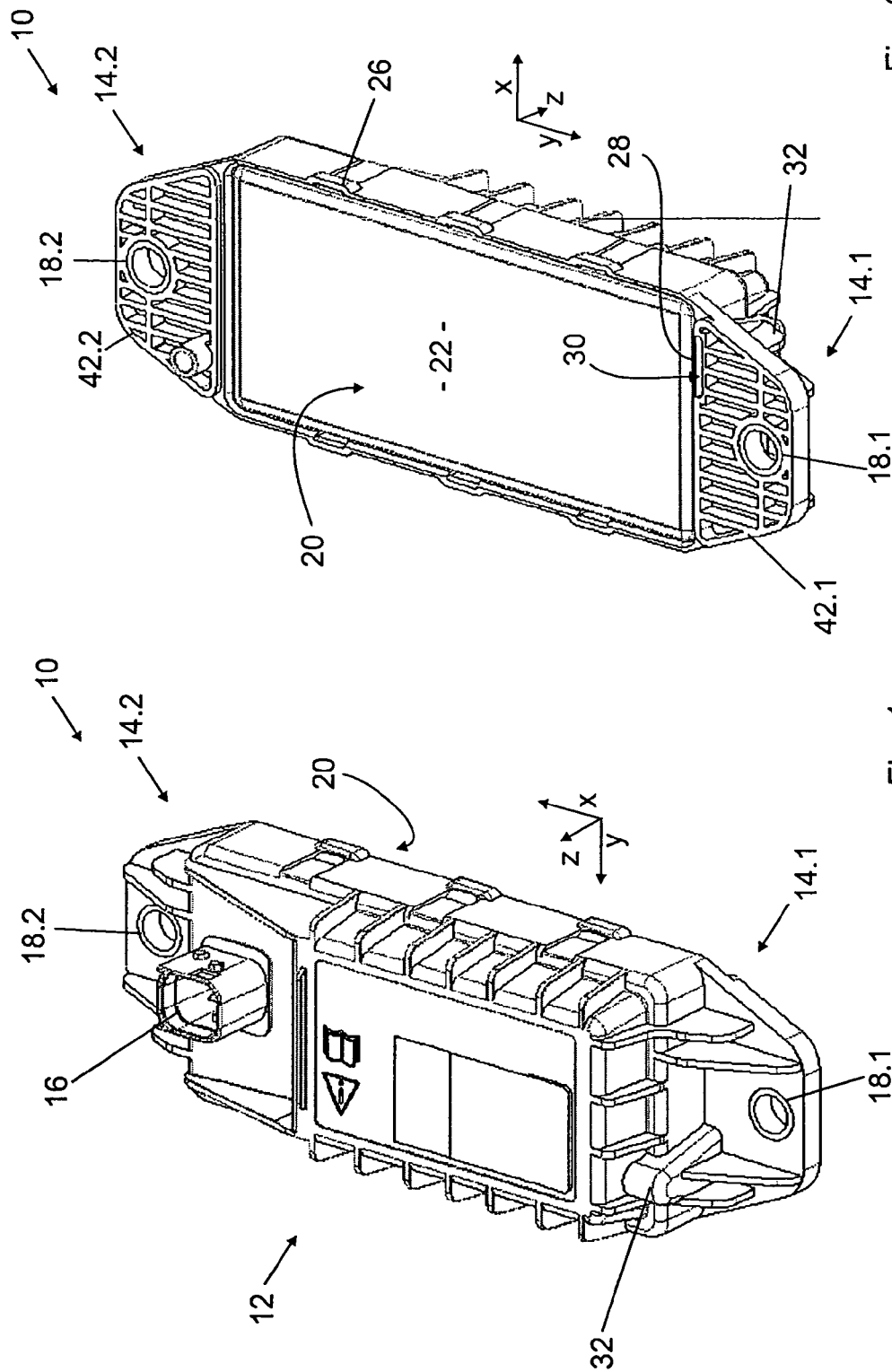

HOUSING FOR AN ELECTRONIC UNIT

FIELD OF THE INVENTION

Figure 3:
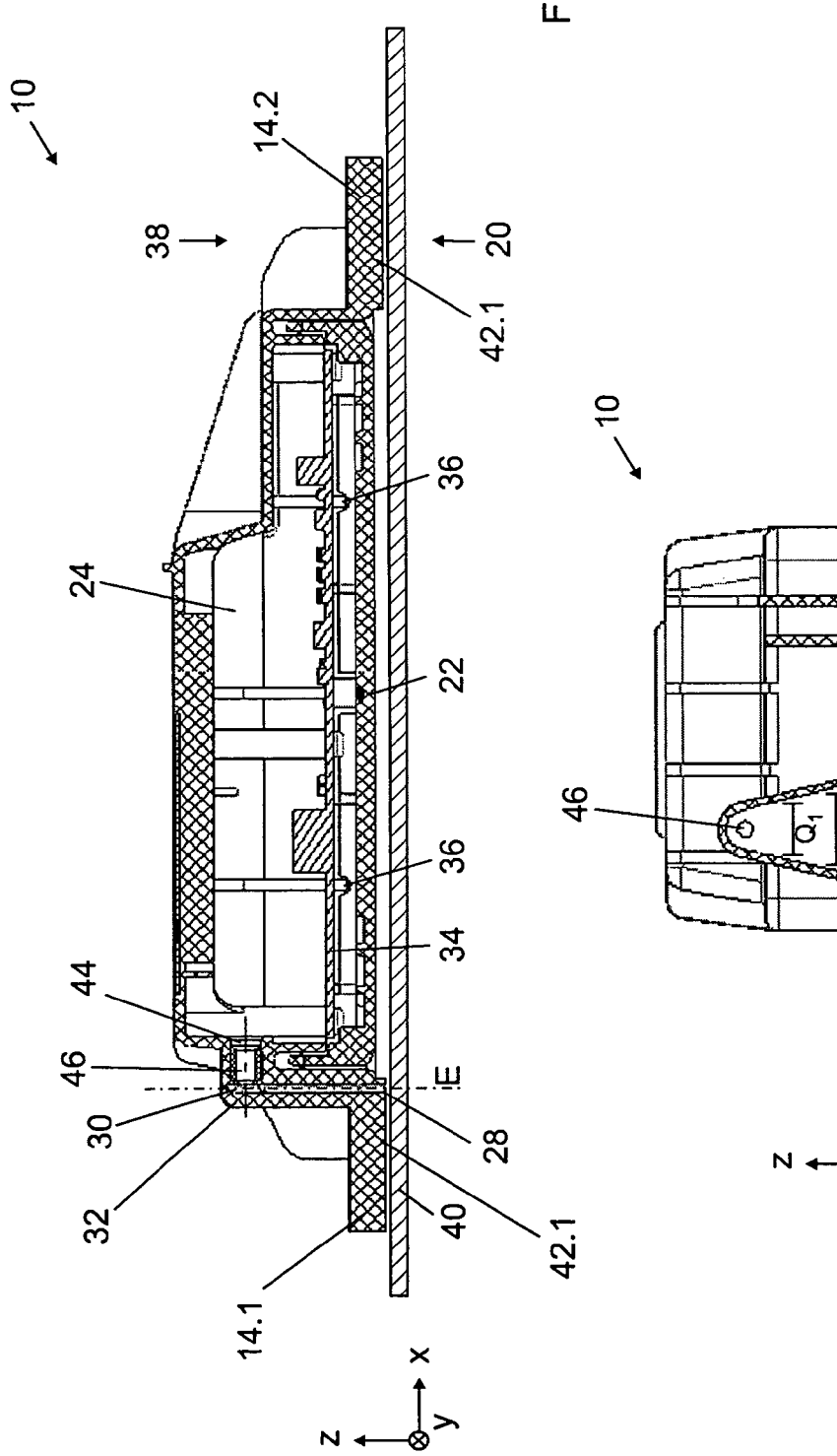
Figure 4:
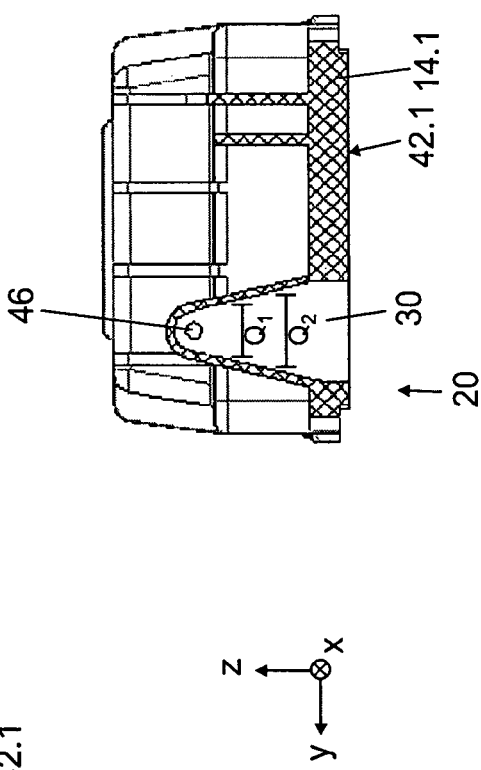
Figure 5:
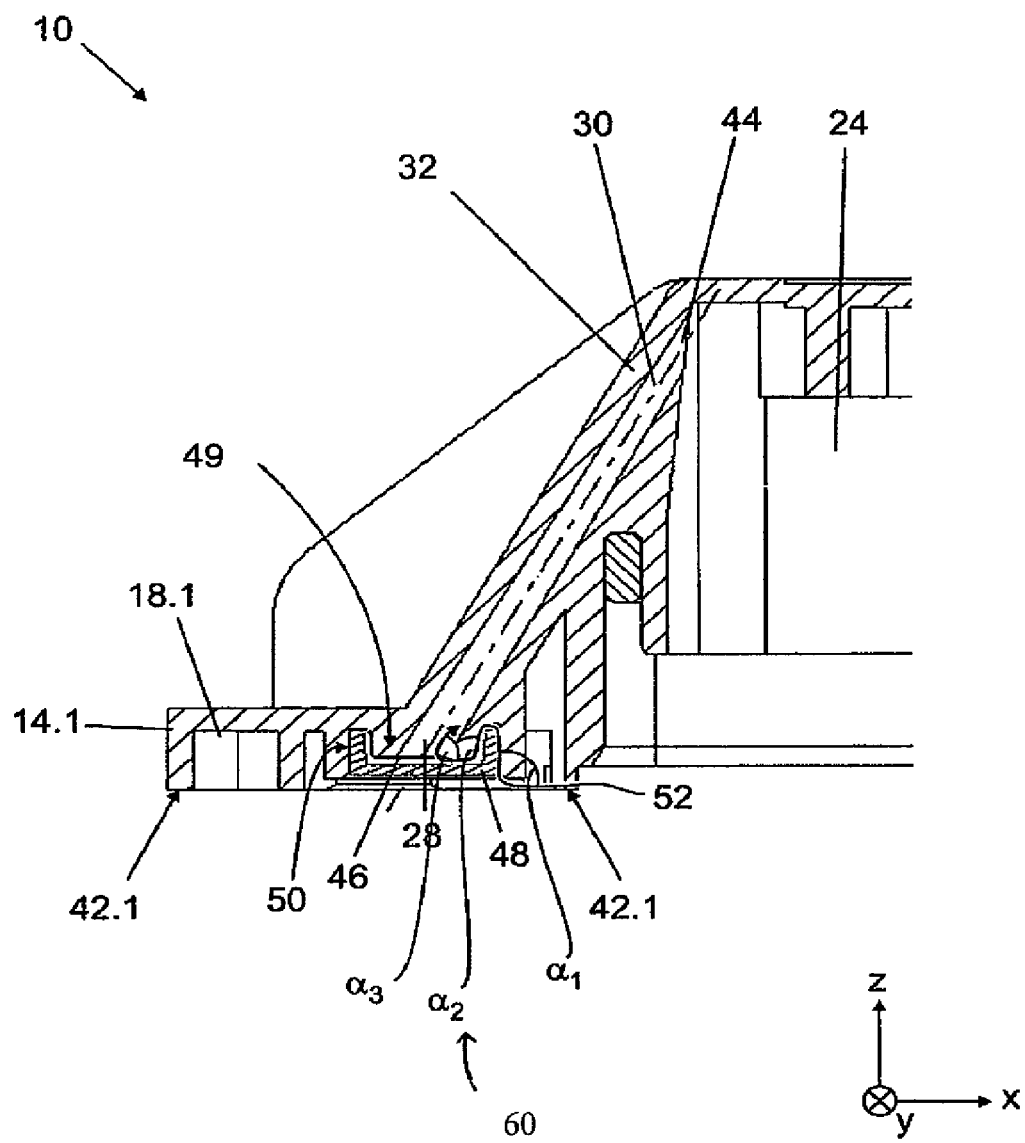
Figure 6:
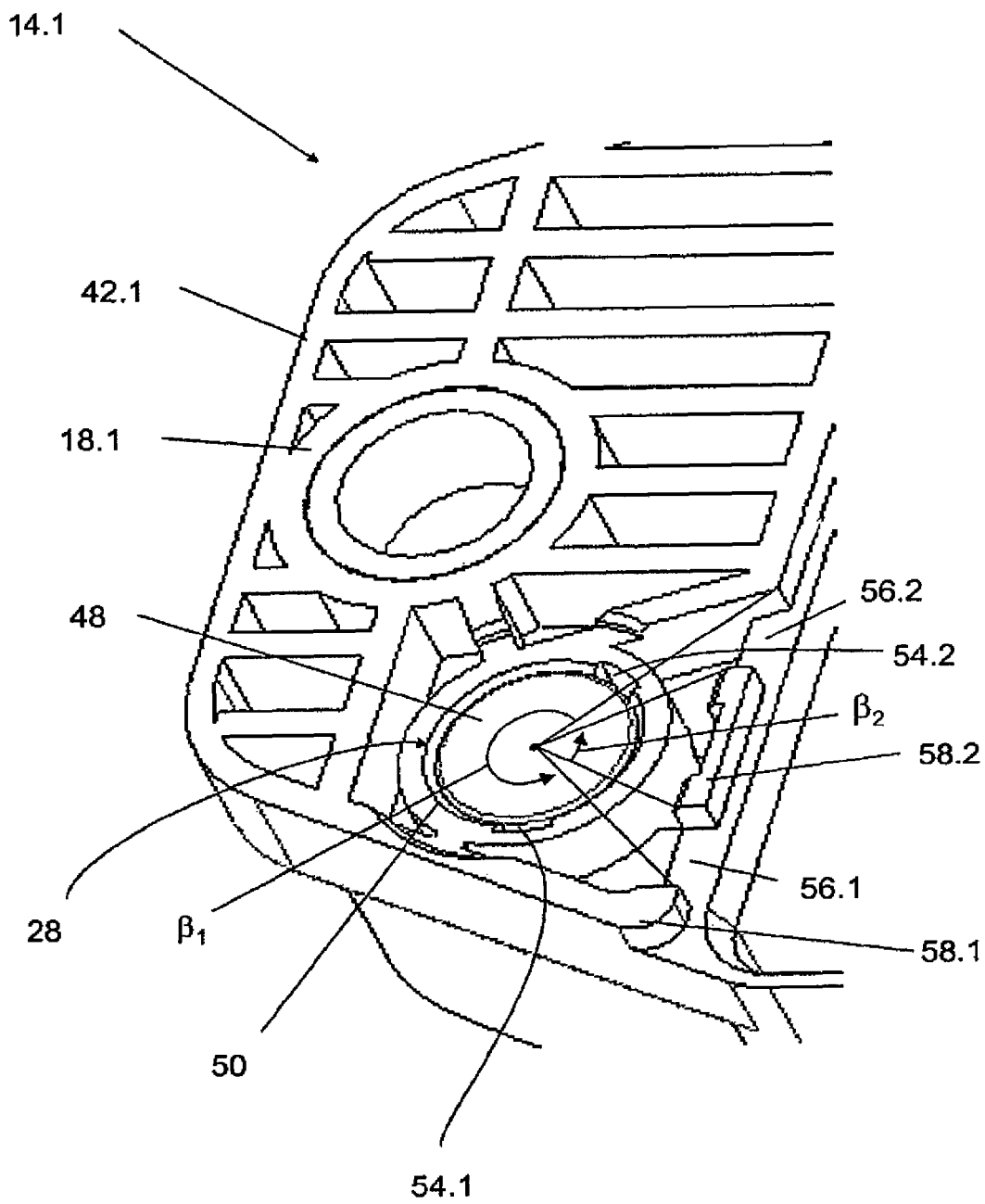

The present invention generally relates to an improved housing for an electronic unit, the housing including a space for receiving a printed circuit board, one or more feet, and a venting device. The present invention also relates to a method for manufacturing a vehicle incorporating the electronic unit housing.

BACKGROUND OF THE INVENTION

Housings for vehicle electronic units receive electronic components disposed on printed circuit boards. The printed circuit boards must be protected from dust and moisture.

Vehicle electronic unit housings are regularly exposed to large temperature fluctuations. During a rise in temperature, air in the receiving spaces of the housings expand and must be discharged to the outside in order to prevent mechanical stresses that could cause the housings to rupture. Conventionally, venting devices are used that place the receiving spaces in communication with atmosphere surrounding the housings.

For aesthetic reasons, electronic unit housings are frequently painted over, together with the components on which they are disposed. With conventional electronic unit housings, it is possible for atomized paint to settle in and clog the venting devices. In addition, electronic unit housings are regularly cleaned together with their associated vehicles by means of steam jets. With conventional electronic unit housings, this can result in moisture penetrating the receiving spaces and causing damage (e.g., to membranes therein).

SUMMARY OF THE INVENTION

Generally speaking, in accordance with embodiments of the present invention, an improved housing for an electronic unit is provided which overcomes disadvantages associated with conventional electronic unit housings. In accordance with embodiments of the present invention, the housing includes (i) a space for receiving a printed circuit board, (ii) at least one foot constructed and arranged to fasten the housing onto a base, and (iii) a venting device which opens on the side of the housing facing the base. By this construction, the venting device is well protected from atomized paint or steam.

According to an embodiment of the present invention, the venting device opens into the foot.

Within the scope of the present description, the foot refers in particular to that region of the electronic unit housing which is disposed to the side of a projection of the receiving space onto the base. The electronic unit housing may have two feet, which are disposed on the two sides of the receiving space. The foot can be constructed as a strap and comprise a mounting device, such as, for example, a fastening eye, by which the electronic unit housing can be fastened onto a component, such as, for example, a vehicle component.

The electronic unit housing lies flat, with its underside on the base. Thus, it would be expected that the position at which the venting device opens on the underside is irrelevant. However, the arrangement of the foot offers clear advantages compared with an arrangement at other positions of the underside of the electronic unit housing. Since the foot is fastened to the vehicle component, it is there that the contact pressure is high and the sealing action is particularly effective.

An advantage of the configuration according to embodiments of the invention is that it can be easily manufactured and is very robust against aerosols, such as are emitted, for example, by a jet or a can during painting.

According to an embodiment of the present invention, the venting device has an internal opening to the receiving space and an external opening, in communication with the internal opening via a venting duct, for venting the receiving space, wherein at least one of the openings (external and internal), is covered with a membrane of stretched plastic or other suitable material (e.g., GORE-TEX). This membrane has micropores that are large enough to allow air to pass while blocking water or paint particles.

An advantage of this construction is that the venting device is protected reliably against penetrating particles by simple means. It is preferable to provide the membrane where the venting device opens into the foot. In this case, contamination of the membrane is largely ruled out, since even the finest particles are deposited at other positions of the electronic unit housing before they can reach the external opening on their path through the foot.

In another embodiment of the present invention, the external opening and the membrane are covered with a cap, wherein the cap has a recess that embraces the membrane and wherein the recess is positioned relative to (directed away from) the base such that a labyrinth effect is achieved. That is, air flowing from atmosphere surrounding the electronic unit housing into the receiving space must first travel substantially parallel to the underside to reach the external opening, after which it must change direction and flow away from the underside, then again change direction and flow back toward the underside, before changing direction one more time and entering the venting duct. In this way, aerosol particles will likely be deposited on the cap, for example, or on another component of the electronic unit housing, thus preventing them from reaching and contaminating the membrane.

It is also possible to provide, in the foot, ribs angled toward one another in a straddled configuration and arranged so as to drain off stagnant water.

Preferably, the venting duct broadens in diameter from the internal opening to the external opening. It is not necessary that the venting duct have a circular cross section for this purpose. For example, it is possible for the venting duct to be a slot. In this case, the feature that the venting duct broadens in diameter from the internal opening to the external opening will be understood to mean that a maximum cross section of the venting duct increases in diameter. Stagnant moisture in the venting duct can be prevented in this way.

According to another embodiment of the present invention, the foot is constructed such that a rim of the foot rests flat on the flat base, with the rim surrounding the external opening. The rim will be understood to be that part of the foot which is in contact with the respective base when the electronic unit housing is mounted. This rim blocks the penetration of aerosol laden air into the foot.

Because the rim surrounds the external opening, the air must first flow past the electronic unit housing in the region of the receiving space before it can reach the external opening. Aerosol particles can be deposited along this path, thus protecting the membrane from contamination.

By the feature that the rim surrounds the external opening it is to be understood that, when the electronic unit housing is mounted on the base, no direct linear path exists from anywhere in the atmosphere surrounding the foot through the rim to the external opening. For this purpose, it is not necessary that the rim completely surround the external opening. For example, it is sufficient that, as viewed from the external opening, the rim surround three quarters of a circumferential angle of the external opening.

According to another embodiment of the present invention, the foot has a fastening eye, the eye diameter of which is such that the external opening is disposed at a distance of less than four times the eye diameter from the fastening eye. The distance in this case is to be understood to be the distance between the respective centers of the fastening eye on the one hand and of the external opening on the other hand. Because the foot is screwed onto the fastening eye, a particularly large force is present there to press the electronic unit housing against the base. In the vicinity of the fastening eye, the rim is thereby pressed particularly firmly onto the base, and, so, it is particularly difficult for aerosol laden air to penetrate toward the external opening.

The present invention also is directed to a method for manufacturing a vehicle, including the steps of mounting an electronic unit housing as described herein on a component of the vehicle and painting the component and vehicle together. As described above, this common painting operation is irrelevant to the functional performance of the venting device, since the aerosol laden air produced during painting cannot harm the membrane.

Still other objects and advantages of the invention will in part be obvious and will in part be apparent from the specification.

The invention accordingly comprises the features of construction, combination of elements, and arrangement of parts which will be exemplified in the constructions hereinafter set forth, as well as the various steps and the relation of one or more of such steps with respect to each of the others, and the scope of the invention will be indicated in the claims.

BRIEF DESCRIPTION OF THE DRAWINGS

For a fuller understanding of the invention, reference is had to the following description taken in connection with the accompanying drawings in which:

FIG. 1 is a top perspective view of an electronic unit housing according to an embodiment of the present invention;

FIG. 2 is a bottom perspective view of the embodiment of the electronic unit housing depicted in FIG. 1;

FIG. 3 is a longitudinal cross-sectional view of the embodiment of the electronic unit housing depicted in FIG. 1;

FIG. 4 is a transverse cross-sectional view of the embodiment of the electronic unit housing depicted in FIG. 1;

FIG. 5 is a longitudinal cross-sectional view of an electronic unit housing according to another embodiment of the present invention; and FIG. 6 is a perspective view of a foot of the embodiment of the electronic unit housing depicted in FIG. 5.

DETAILED DESCRIPTION OF THE PREFERRED EMBODIMENTS

Referring now to the drawing figures, FIG. 1 shows an electronic unit housing 10 in the form of, for example, an injection-molded plastic article having a main body 12 and feet 14.1, 14.2 disposed on the two sides of main body 12 and integrally joined to main body 12. A socket 16 is provided on main body 12, into which a plug can be inserted and which is designed for connection to a printed circuit board disposed in the main body.

Foot 14.1 has a fastening eye 18.1 in the form of an overmolded metal sleeve. In the same way, foot 14.2 comprises a fastening eye 18.2. Feet 14.1, 14.2 are designed to fasten electronic unit housing 10 onto a base such that the housing rests with at least one part of its underside 20 flat on the base.

FIG. 2 shows electronic unit housing 10 from its underside 20 so that a cover plate 22 for a receiving space 24 disposed behind it (see FIG. 3) is visible. Cover plate 22 seals off underside 20 flush with feet 14.1, 14.2 or is slightly offset from underside 20. Cover plate 22 seals receiving space 24 and can be fastened by means of a snap connector 26, for example.

FIG. 2 shows a slot-like external opening 28 via which a venting duct 30 opens to the outside. Venting duct 30 is bounded by a venting-duct wall 32.

FIG. 3 is a cross-sectional view, in longitudinal direction, of electronic unit housing 10 (x-direction; see FIG. 1), through venting duct 30. A printed circuit board 34 is disposed in receiving space 24, where it is fastened, for example by means of screws 36, to electronic unit housing 10. Relative to underside 20, cover plate 22 is shifted toward an upper side 38 of electronic unit housing 10, and, thus, it is not in contact with a base 40 on which electronic unit housing 10 is mounted.

Feet 14.1, 14.2 rest within a respective rim 42.1, 42.2 on base 40. Venting duct 30 ends with its external opening 28 in an inside part of rim 42.1 (see FIG. 2).

At its end remote from external opening 28, venting duct 30 has an internal opening 44, which represents the transition into receiving space 24. A membrane 46 of, for example, stretched plastic is mounted adjacent to internal opening 44. The membrane has a pore diameter that allows air to pass but blocks water droplets. Membrane 46 surrounds a cylinder (e.g., formed from rubber), to which a stretched film (e.g., formed from plastic) is attached (e.g., bonded), and is held in electronic unit housing 10 with, for example, a claw ring.

FIG. 4 is a sectional view through an air admission duct taken along plane E (see FIG. 3), which runs in a transverse direction of electronic unit housing 10. Venting duct 30, viewed in a cross section Q, becomes smaller with increasing distance from the underside. External opening 28 is disposed directly adjacent to rim 42.1.

FIG. 5 is a partial/cross-sectional view through venting duct 32 of another embodiment of an inventive electronic unit housing 10. External opening 28 is covered with a cap 48, which is attached (e.g., clipped) into recess 50 in foot 14.1. Membrane 46 covers external opening 28 of venting duct 30.

Cap 48 is constructed such that air flowing into venting duct 30 undergoes three changes of direction by respective direction-change angles $\alpha_1$, $\alpha_2$, $\alpha_3$ of more than 160° each, as indicated by inflow path 52. As shown in FIG. 5, direction-change angles $\alpha_1$, $\alpha_2$, $\alpha_3$ can lie in a common plane, although they are not required to do so.

FIG. 6 is a detailed perspective view of the foot according to FIG. 5. Cap 48 is fitted into recess 50 such that two air admission slots 54.1, 54.2 are formed. Air admission slots 54.1 and 54.2 have a width that corresponds to a fraction of the circumference of cap 48.

FIG. 6 shows how rim 42.1 surrounds external opening 28 and cap 48 almost completely. Air attempting to pass rim 42.1 is able to enter the rim only through air inlets 56.1, 56.2. Thus, the rim surrounds external opening 28 over a circumferential angle $\beta=\beta_1+\beta_2$ of greater than 270°.

Cap 48 has a recess 49 and forms, together with foot 14.1, a labyrinth, which causes aerosol particles contained in entering air to be deposited first at ribs 58.1, 58.2 of foot 14.1, before external opening 28 is reached. Ribs 58.1, 58.2 are angled toward one another at an angle of 45° to 135°, for example. Venting duct 30, membrane 46 and cap 48 are parts of a venting device 60.

Accordingly, the present invention provides an electronic unit housing of simple construction that is robust in its protection against penetration by aerosols (e.g., atomized paint or steam).

It will thus be seen that the objects set forth above, among those made apparent from the preceding description, are efficiently attained, and since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An electronic unit housing, comprising:
   a main body;
   a receiving space defined in said main body for receiving a printed circuit board;
   at least one foot constructed and arranged to fasten to a base, said at least one foot being disposed to a side of said receiving space relative to a projection of said receiving space onto said base; and
   a venting device, said venting device opening into said at least one foot.

2. The electronic unit housing according to claim 1, wherein said venting device includes an internal opening and an external opening defined therein, said internal opening communicating with said receiving space, said external opening communicating with said internal opening via a venting duct for venting said receiving space, said external opening being covered with a membrane.

3. The electronic unit housing according to claim 2, wherein said membrane is a stretched plastic membrane.

4. The electronic unit housing according to claim 2, further comprising a cap for covering said external opening and said membrane, said cap having a recess directed away from said base that embraces said membrane.

5. The electronic unit housing according to claim 2, wherein said venting duct broadens in cross section from said internal opening to said external opening.

6. The electronic unit housing according to claim 2, wherein said at least one foot includes a fastening eye having an eye diameter, said external opening being disposed at a distance from said fastening eye of less than four times said eye diameter.

7. A method for manufacturing a vehicle, comprising the steps of mounting an electronic unit housing according to claim 1 on a component of a vehicle and painting said component and said vehicle together.

8. An electronic unit housing, comprising:
   a main body;
   a receiving space defined in said main body for receiving a printed circuit board;
   at least one foot constructed and arranged to fasten to a base, said at least one foot being disposed to a side of said receiving space relative to a projection of said receiving space onto said base; and
   a venting device, said venting device opening on an underside of said main body facing said base, and wherein said venting device includes an internal opening and an external opening defined therein, said internal opening communicating with said receiving space, said external opening communicating with said internal opening via a venting duct for venting said receiving space, said external opening being covered with a membrane, and wherein said at least one foot is constructed and arranged such that a rim of said at least one foot is disposed flat on said base and surrounds said external opening.

* * * * *